United States Patent [19]

Fujimaki et al.

[11] Patent Number: 5,173,620

[45] Date of Patent: Dec. 22, 1992

[54] DEVICE FOR ELIMINATING TRAP OF MAGNETIC FLUX IN A SUPERCONDUCTION CIRCUIT

[75] Inventors: Norio Fujimaki, Atsugi; Kohtaroh Gotoh, Tokyo, both of Japan

[73] Assignee: Fujitsu Limited, Kawasaki, Japan

[21] Appl. No.: 627,033

[22] Filed: Dec. 13, 1990

[30] Foreign Application Priority Data

Dec. 15, 1989 [JP] Japan .................. 1-325308
Aug. 20, 1990 [JP] Japan .................. 2-217195

[51] Int. Cl.$^5$ .................. H03K 3/38; H03K 17/92; H03K 19/003; H03K 19/195
[52] U.S. Cl. .................. 307/306; 307/310; 505/825; 257/31
[58] Field of Search .............. 307/306, 310, 245, 476; 357/5; 505/845, 883, 861, 863, 865, 825

[56] References Cited

U.S. PATENT DOCUMENTS

| | | | |
|---|---|---|---|
| 3,478,230 | 11/1969 | Otter, Jr. et al. | 307/306 |
| 4,361,768 | 11/1982 | Rajeevakumar | 307/306 |
| 4,392,148 | 7/1983 | Chang et al. | 357/5 |
| 4,764,837 | 8/1988 | Jones | 307/306 |
| 4,869,598 | 9/1989 | McDonald | 307/306 |
| 4,943,792 | 7/1990 | Srivastava et al. | 335/216 |

FOREIGN PATENT DOCUMENTS 1-42512 9/1989 Japan .
1-302876 12/1989 Japan .

Primary Examiner—John Zazworsky
Attorney, Agent, or Firm—Staas & Halsey

[57] ABSTRACT

An apparatus for eliminating a magnetic flux from a superconducting circuit comprises a substrate on which a superconducting circuit is formed, a heating fixture including resistance heating elements and provided in the vicinity of the superconducting circuit, a driving unit connected to the heating fixture for energizing the same by supplying a drive current to each resistance heating elements in the heating fixture. The heating fixture is so configured that, upon energization of the resistance heating elements in the heating fixture, there is formed a region of normal conduction state characterized by a temperature that exceeds the critical temperature of the normal conduction-superconduction transition, in at least a part of the superconducting circuit, and such that the heating fixture produces a minimized magnetic field upon the energization of the resistance heating elements. The driving unit controls energization of the heating fixture such that the region of normal conduction state moves consecutively and continuously to a periphery of the superconducting circuit.

22 Claims, 14 Drawing Sheets

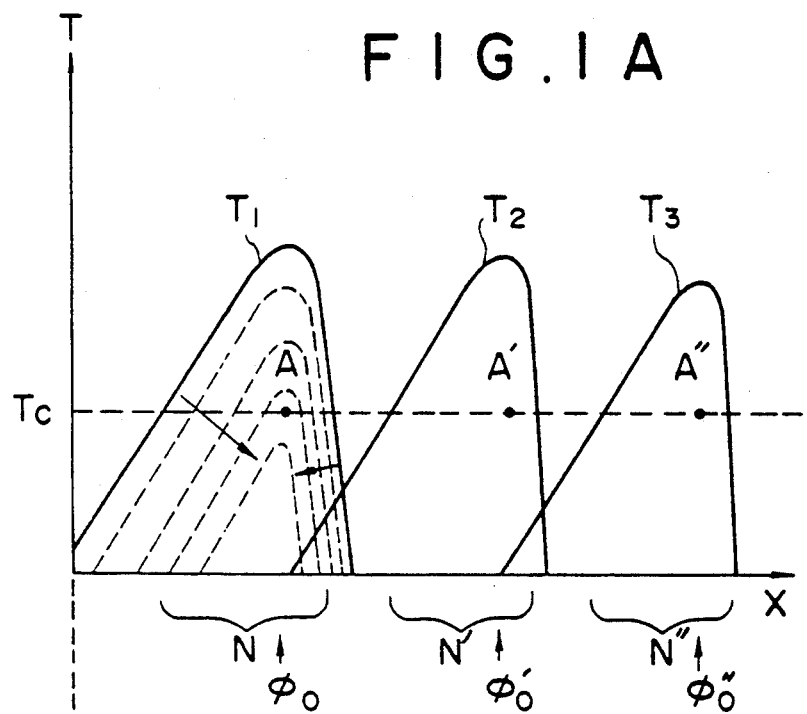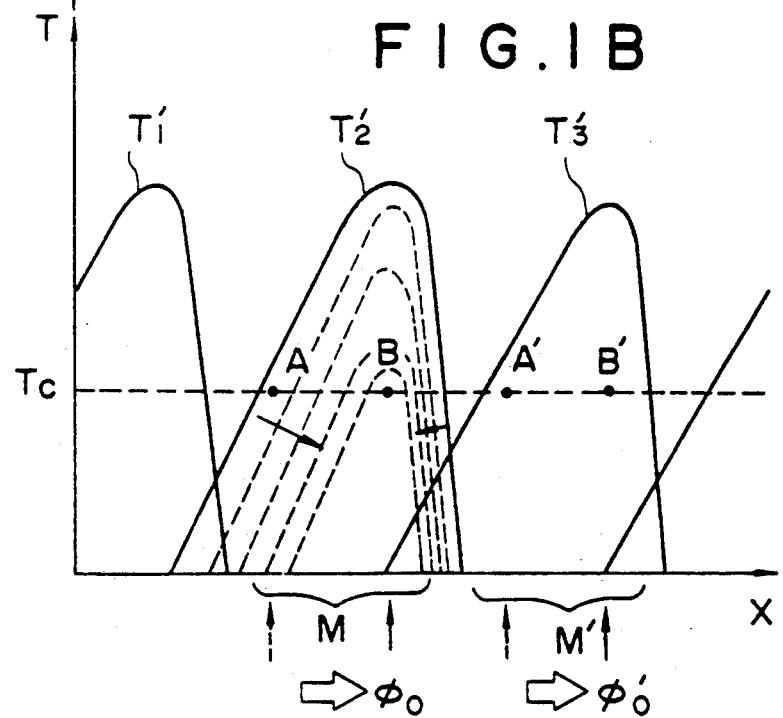

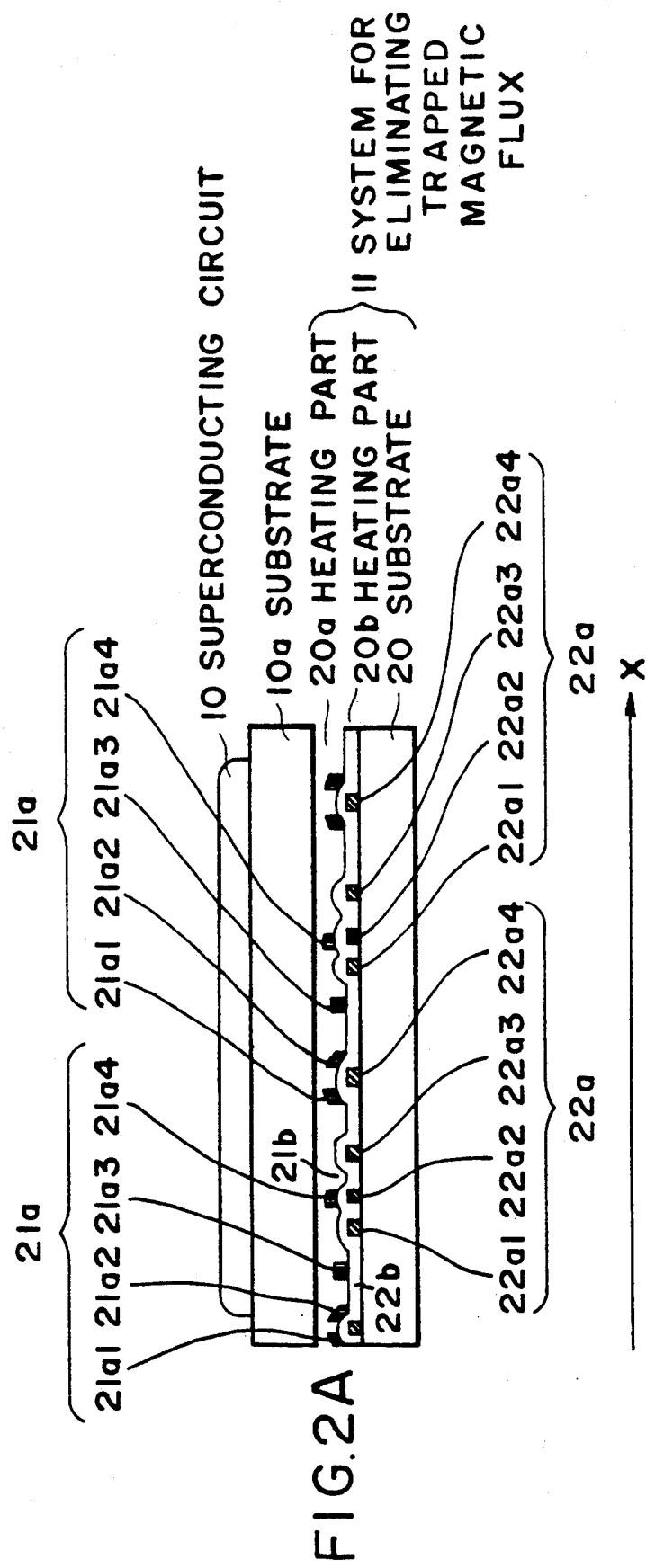

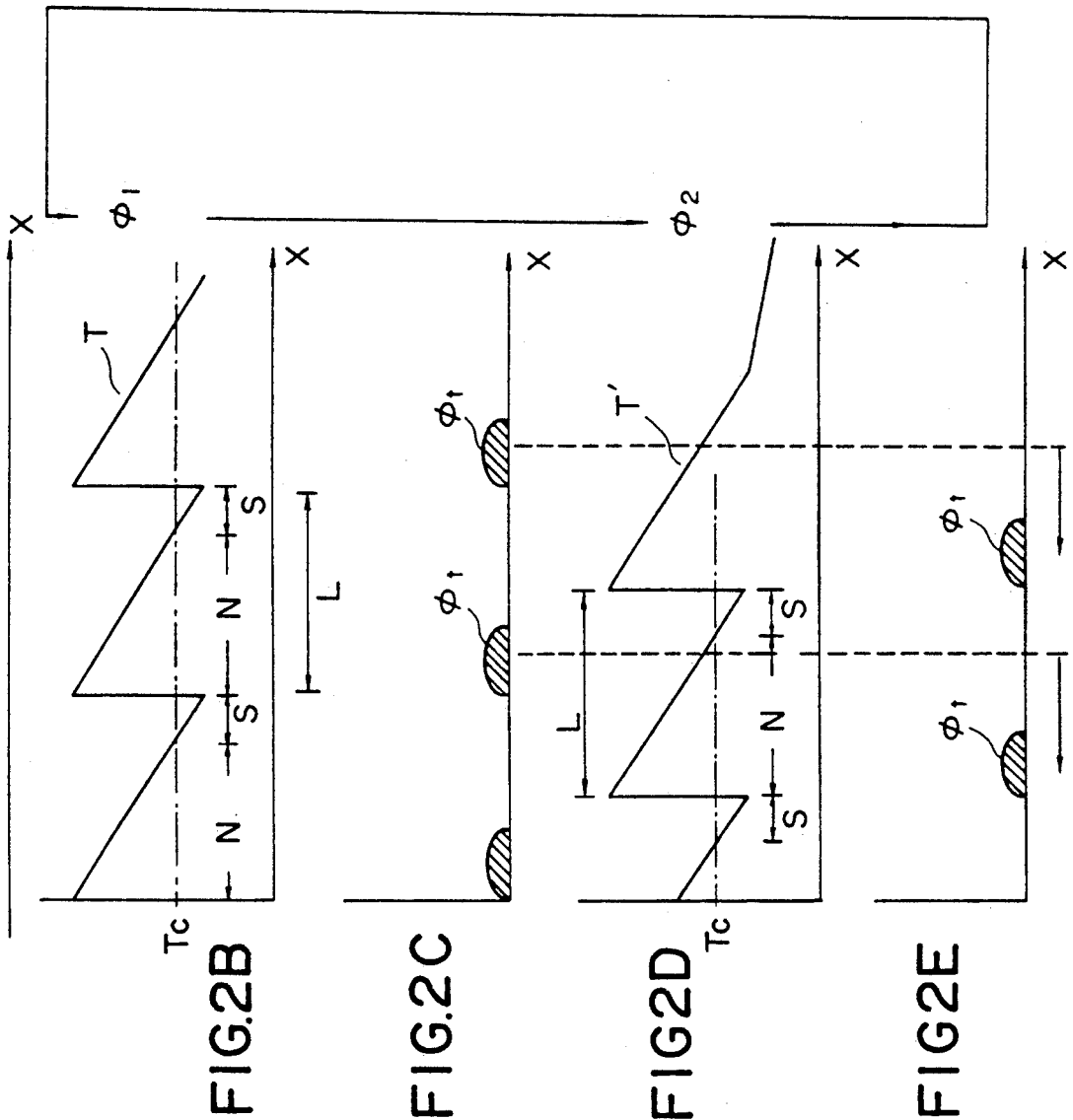

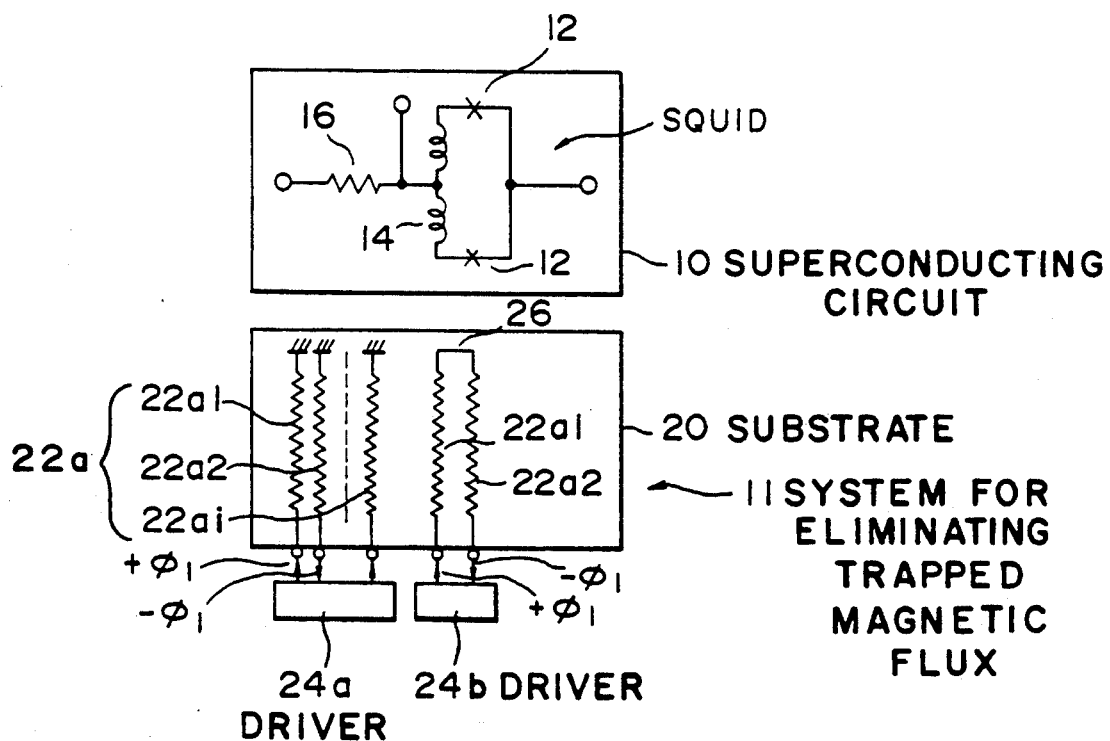

TRAPPED FLUX ELIMINATED

WITH TRAPPED FLUX

DEVICE FOR ELIMINATING TRAP OF MAGNETIC FLUX IN A SUPERCONDUCTION CIRCUIT

BACKGROUND OF THE INVENTION

The present invention generally relates to superconducting circuits and more particularly to a system for eliminating trapped magnetic flux from a superconducting circuit.

Superconducting circuits such as SQUIDs (superconducting quantum interference device) or Josephson circuits are studied intensively. The former is studied in relation to magnetic detectors and sensors that have an ultra-high sensitivity while the latter is studied in relation to the ultra-fast logic devices and computers.

In these superconducting circuits that use the superconducting phenomenon, there arises a problem in that the external magnetic flux, such as the one formed by the earth's magnetic field, is often trapped in a superconductor when the superconducting circuit is cooled across a critical temperature, above which the superconductor assumes the normal conduction state, and below which the superconductor assumes the superconduction state. When such a trap of magnetic flux occurs in the superconductor that forms the essential part of the superconducting device, the operation of the device is influenced unwantedly by the trapped magnetic flux. For example, the threshold characteristic of the SQUIDs may be modified upon the trapping of the magnetic field as will be described later.

In principle, such a trap of the magnetic flux would not occur when the superconductor is formed as a thin strip and cooled consecutively from one end to the other. However, the cooling is generally made for the entire superconductor body in one step by immersing in a liquid helium, and there is a tendency that a region of normal conduction remains in the region of the superconduction like an isolated island due to the fluctuation of temperature at the time of crossing of the critical temperature. Generally, such a fluctuation of the temperature cannot be eliminated completely while the minute fluctuation is enough to cause the trapping of the magnetic flux.

Conventionally, efforts are made to eliminate such a trap of the magnetic flux by using a magnetic shield such as a permalloy enclosure or superconducting enclosure to eliminate the external magnetic field. In this approach, the cooling of the superconducting circuit across the critical temperature is made in such a magnetic shield enclosure. Alternately, there is proposed a use of so-called moat structure wherein a groove called "moat" is provided on the ground plane of the superconducting device to surround the essential part of the device. In the latter construction, exclusion of the magnetic flux is possible by setting the area S of the essential part of the device to satisfy a relation $S \times B < \phi_0/2$, where $\phi_0$ represents the flux quantum in the superconductor. It should be noted that the magnetic flux is quantized in the superconducting materials. In the latter construction, one can expel the magnetic flux from the superconductor into the moat that is formed to surround the essential part of the device. The foregoing approaches, however, can provide only a limited success in eliminating the trap of the magnetic flux particularly in the large sized superconductor circuits such as the SQUID, even when the former and the latter constructions are combined.

There is another approach to eliminate the magnetic flux known as a heat flash process, wherein the superconductor is heated to a temperature above the critical temperature by using a resistance heater formed in or adjacent to the superconducting material. By cooling the superconductor again to below the critical temperature, there occurs a random fluctuation of the temperature that is induced naturally, and such a fluctuation of temperature causes a modified distribution of the flux quantum in the superconducting material. By repeatedly heating and cooling the superconductor, the chance that the flux quantum is moved to the outside of the superconductor or at least displaced from the critical part of the superconducting circuit is increased and it is expected that the residual flux quantum is gradually eliminated from the superconducting circuit. In this heat flash approach, however, the heating of the superconductor has to be made with utmost care, particularly when a resistance heater is employed for the purpose, such that the magnetic flux accompanying the electric current that is used to drive the resistance heater does not enter the superconducting material. Otherwise, new flux quantum would be trapped in the superconducting material and the adversary effect of the residual flux quantum is not reduced but enhanced. Further, the conventional resistance heaters used for this purpose generally cause a uniform heating of the superconductor. Thereby, the movement of the flux quantum occurs only as a matter of chance, and the expelling of the flux quantum to the outside of the superconductor is not guaranteed. Thus, there usually remains substantial amount of flux quanta in the superconductor even if the process is repeated for a number of times.

Further, there is another known approach, described in the Japanese Patent Publication No. 1-42512, to eliminate the flux quantum from the superconductor forming a superconducting circuit, wherein the heating of the superconductor to a temperature above the critical temperature is made by a laser beam irradiation. In this approach, the laser beam is scanned over the superconductor held in the superconducting state, starting from one end to the other end, such that a region of normal conduction state, formed as a result of the heating by the laser beam, is moved from the foregoing one end to the other end. Thereby, the region of the normal conduction collects the flux quantum in the region that is swept by the laser beam and the flux quantum thus collected is transported to the outside of the superconductor.

In operation, the location of the superconductor containing the residual flux quantum is identified at first by using a SQUID detector, and the laser beam is directed to such a region thus detected. The laser beam is then moved along the surface of the superconductor until the beam spot goes off. Further, the foregoing process is repeated until the flux quantum is eliminated from the superconductor.

This approach, however, requires a complex scanning mechanism of the laser beam in addition to the laser apparatus itself. Further, the scanning mechanism can generally provide only the linear scanning and the efficiency of the flux elimination is small. Furthermore, the shape of the superconductor that can be applicable to this known process is limited even when the scanning mechanism is combined with a rotation mechanism to irradiate the superconductor from all directions.

SUMMARY OF THE INVENTION

Accordingly, it is a general object of the present invention to provide a novel and useful system and process for eliminating a flux quantum from a superconducting circuit, wherein the foregoing problems are eliminated.

Another and more specific object of the present invention is to provide a system and a process for eliminating a flux quantum of a magnetic field trapped in a superconductor forming a superconducting circuit, wherein the elimination of the flux quantum is made efficiently with a simple construction.

Another object of the present invention is to provide a system and process for eliminating a flux quantum of a magnetic field trapped in a superconductor forming a superconducting circuit, wherein the elimination of the flux quantum is made by providing a heating unit that produces a non-uniform distribution of the temperature in the superconductor upon energization.

Another object of the present invention is to provide a system and process for eliminating a flux quantum of magnetic field trapped in a superconductor forming a superconducting circuit, comprising heating means that heats the superconductor to a temperature above the critical temperature of the superconductor-normal conductor transition wherein the heating means is configured such that the heating means produces a magnetic field of minimized intensity upon energization.

Another object of the present invention is to provide a system and process for eliminating a flux quantum trapped in a superconductor forming a superconducting circuit, comprising heating means provided adjacent to the superconductor for heating the superconductor to a temperature above a critical temperature of the normal conduction-superconduction transition, wherein the heating means is configured to produce a temperature distribution such that there is formed a controlled temperature gradient in the superconductor in response to energization, and wherein the heating means is configured to cancel the magnetic field that is produced in association with a drive current used for driving the heating means. According to the present invention, the flux quantum of the external magnetic field that is trapped in the superconductor is efficiently eliminated by using the heating means that heats a large area simultaneously with a systematic procedure. Further, the unwanted trap of magnetic flux produced by the electric current used for driving the heating means is minimized by arranging the heating means such that the electric driving current of the heating means induces a dipole or quadrupole magnetic field that attenuates rapidly with separation from the heating means.

Other objects and further features of the present invention will become apparent from the following detailed description when read in conjunction with the attached drawings.

BRIEF DESCRIPTION OF THE DRAWINGS

FIGS. 1A and 1B are diagrams showing the principle of a first embodiment system of the present invention;

FIGS. 2A-2E are diagrams showing the construction and operation of the first embodiment system of the present invention;

FIG. 3 is a diagram showing the driving of the first embodiment system intended to minimize the effect of the magnetic field that is induced upon driving of the system;

DETAILED DESCRIPTION

Figures 4A, 4B:
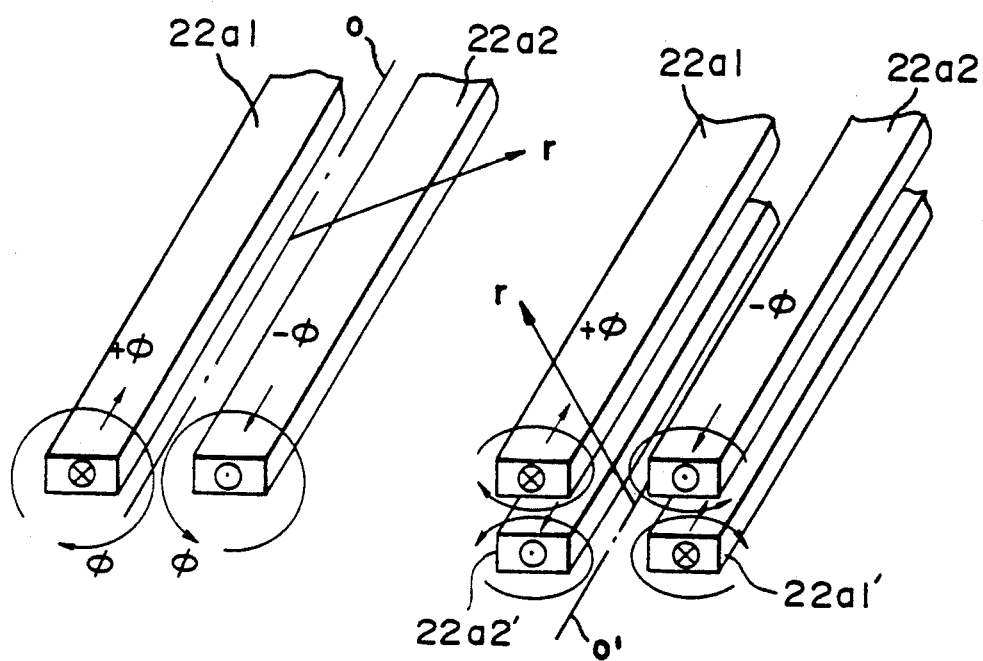
FIGS. 4A and 4B are diagrams showing the actual construction of the heating elements employed in the system of the present embodiment.

First, the principle of the present invention will be described with reference to FIGS. 1A and 1B showing the operation of a first embodiment system of the present invention.

In the present invention, the trapped flux quantum is eliminated from the superconductor circuit by inducing a temperature distribution in the superconductor circuit such that a part thereof exceeds the critical temperature of the normal conduction-superconduction transition. Further, the temperature distribution thus induced is changed periodically with time such that region of the normal conduction is moved across the superconducting circuit. It should be noted that superconducting materials generally expel magnetic fields when in the superconducting state, and any magnetic flux, that is trapped in the superconducting material due to the non-uniform cooling of the superconducting material in a magnetic field, exists in the form of quantized magnetic flux or flux quantum. The flux quantum thus trapped in the superconducting material is generally pinned at a small area and does not move around easily.

Referring to FIGS. 1A showing the distribution of the temperature in the superconducting circuit at a first instance or first operational cycle, there are induced a plurality of temperature profiles T1, T2, T3, . . . as represented by the continuous line as a result of heating of the superconducting circuit. In FIG. 1A, the ordinate represents the temperature of the superconducting circuit and the abscissa represents the horizontal dimension x of the superconducting circuit. Each curve represents the highest temperature distribution reached in the process of the heating cycle. In response to the temperature distribution thus achieved, there are formed a plurality of regions N, N', N'', . . . wherein the temperature exceeds the critical temperature of the normal conduction-superconduction transition. In other words, the superconducting material is in the normal conduction state in these regions N, N', N'', . . . In each region N, N' or N", there is defined a location A, A', or A" that corresponds to the highest temperature or temperature peak that is reached in the temperature distribution curve T, T' or T". It should be noted that, in these regions of the normal conduction state, the magnetic flux is no longer quantized and can move freely. It should be noted that there exists the region of superconducting state at both sides of the normal conduction region N, N' and N".

Next, the temperature of the superconducting circuit is decreased while maintaining the temperature profile as shown by arrows in FIG. 1A. Thereby, the temperature distribution profile represented by the broken lines appears one after another as illustrated. With the decrease in the temperature, the normal conduction region such as the region N is narrowed and the region of superconducting state grows from both sides of the region N. With the further decrease in the temperature, the region N finally disappears. In response to the growth of the superconducting region, any magnetic flux in the normal conduction region N is pushed toward the location A. Ultimately, the magnetic flux is collected at the location A and pinned therein in response to the vanishing of the normal conduction region N in the form of flux quanta as represented by $\phi$ in FIG. 1A. Similarly, there occurs a collection of the trapped flux quantum at the location A' and A" as shown by $\phi'$, and $\phi''$.

In the next cycle, different temperature distribution profiles represented in FIG. 1B by T1', T2', T3' ... are induced by heating the superconducting circuit. The temperature distribution profiles T1', T2' and T3' are analogous to those of T1, T2 and T3 except that they are shifted in the horizontal direction with respect to the temperature profiles T1, T2 and T3. Thus, the temperature profile T2' is located between the temperature profile T1 and the temperature profile T2, and the temperature profile T3' is located between the temperature profile T2 and the temperature profile T3. More specifically, the temperature profile T2' is characterized by a peak temperature B that is located at the middle between the location A and the location A'. Similarly, the temperature profile T3' is characterized by a peak temperature B, that is located at the middle between the location A' and the location A". In this case, too, the temperature distribution represented by the continuous line in FIG. 1B represents the highest temperature reached during the heating process.

Next, the superconducting circuit is cooled similarly to the case of FIG. 1A and thereby the temperature profile changes as shown by arrows in FIG. 1B. During the cooling, the shape of the temperature distribution profile is preserved as represented by the broken lines. In this case, too, there is formed a region M or M' of the normal conduction state in response to the region of the superconducting circuit wherein the temperature exceeds the critical temperature Tc. Similarly to the case of FIG. 1A, the normal conduction regions M and M' are laterally bounded by the superconducting regions, and in response to the cooling, the superconducting regions grow while the normal conduction region shrinks. Ultimately, the regions M and M' disappear.

It should be noted that the temperature profile such as the profile T2' is set such that the location A that corresponds to the peak of the previous temperature profile T1 and holds the collected flux quantum or quanta therein, is included in the normal conduction region M that is formed in response to the temperature profile T2' represented in FIG. 1B by the continuous line. Thereby, the flux quantum $\phi_0$ at the location A is moved to the right as shown by a bold arrow at the bottom of the abscissa in FIG. 1B in response to the growth of the superconducting region and collected ultimately at the point B that corresponds to the peak of the temperature profile T2'.

Here, it is important to note that the shape of the temperature profiles T1, T2, T3, ... and T1', T2', T3' ... is made asymmetric with respect to the horizontal direction such that the slope of the temperature profile is gentle at the left half of the profile and steep at the right half thereof. Because of the relatively gentle slope of the profile T2', there occurs a general movement of the flux quantum to the right as indicated by the bold arrow in FIG. 1B in response to the cooling process. Such a movement of the flux quantum occurs in each of the profiles T1', T2', T3', .... Thus, by repeating the process of FIG. 1A and FIG. 1B alternately, the flux quanta trapped in the superconducting circuit are transferred consecutively to the right and finally expelled from the circuit.

Next, a first embodiment of the present invention for implementing the foregoing principle will be described with reference to FIGS. 2A-2E.

Referring to FIG. 2A showing the structure of a superconducting circuit 10 together with a first embodiment system 11 for eliminating the trapped magnetic flux from the superconducting circuit 10, the system 11 of the present invention comprises a substrate 20 on which first and second heating parts 20a configured to form a planar top surface, and the superconducting circuit 10 is placed thereon together with a substrate 10a. The superconducting circuit 10 may be any known circuit such as a Josephson logic circuit or a SQUID.

The heating parts 20a and 20b respectively include therein a number of heating elements, wherein the heating part 20b comprises an insulator layer 22b provided on a top surface of the substrate 20 and a number of heating elements 22a. Each heating element 22a includes resistance strips 22a1, 22a2, 22a3 and 22a4 embedded in insulator layer 22b. On the other hand, the heating part 20a comprises a number of heating elements 21a and is provided on the insulator layer electric insulation from the heating elements 22b. Each heating element 21a includes resistance strips 21a1, 21a2, 21a3 and 21a4 embedded in an insulator layer 21b, and is electrically insulated from the heating elements 22a. In FIG. 2A, the heating elements 21a and 22a are provided to extend parallel with each other in a direction perpendicular to the sheet of the drawing. The insulator layer 21b has a planarized top surface adapted for a uniform contact with the substrate 10a of the superconducting circuit 10.

The important feature of the present embodiment is that the heating elements 21a as well as the heating elements 22a are repetitive units that are repeated with a regular interval in the horizontal direction, and in each unit, the separation or pitch between the resistance strips is changed gradually from one side of the unit to the other side of the unit. In other words, the distribution of the resistance strips is dense in one side of the unit and less dense in the other side of the unit.

In response to such a non-uniform arrangement of the resistance strips 22a1 22a2, 22a3 and 22a4 in heating elements 22a, there appears a distribution of temperature in the superconducting circuit 10 as shown in FIG. 2B upon the energization by a driving current $\phi 1$. This distribution of temperature is substantially identical with the one described with reference to FIG. 1A except that the right and left of the drawing is inverted. Thus, there is formed a region designated N of the normal conduction state in correspondence to the region of the superconducting circuit 10 exceeding the critical temperature Tc and a region designated S of the superconducting state in correspondence to the region lower in temperature than the critical temperature Tc. The temperature is then decreased by reducing the driving current $\phi 1$.

In correspondence to the temperature profile of FIG. 2B and the subsequent decrease in the driving current $\phi 1$, the magnetic flux in the region N is collected at the location of the superconducting circuit 10 that corresponds to a location where the peak of the temperature profile has been located, as the flux quantum $\phi_t$ as shown in FIG. 2C. It should be noted that the temperature profile of FIG. 2B looks like a sawtooth wave and is asymmetric with respect to the horizontal direction. The wavelength L of one sawtooth may be several hundred microns depending on the actual size and construction of the superconducting circuit 10. Thus, the cooling of the superconducting circuit 10 that is made while maintaining the asymmetric shape of the temperature distribution of FIG. 2B causes the collection of the magnetic flux at the left edge of the region N as already explained with reference to FIGS. 1A and 1B. It should be noted further that, during the energization of the resistance strips 22a1, 22a2, 22a3 and 22a4 in the heating elements 21a, the heating part 20b are deenergized.

Next, the resistance strips 21a1, 21a2, 21a3 and 21a4 of the heating elements 21a are energized as shown in FIG. 2D by supplying another driving current $\phi_2$. In response to this, the temperature profile T' shown in FIG. 2D, that is similar to the temperature profile T of FIG. 2B except for a lateral offset, is induced in the superconducting circuit 10. Similarly to the previous case, there is formed the region N of the normal conduction state and the region S of superconducting state, and the flux quanta $\phi_t$ are collected at the region of the superconducting circuit 10 corresponding to where the temperature peak has been located, in response to the subsequent decrease of the driving current $\phi 2$. Thereby, the flux quanta $\phi_t$ that have been collected at the left edge of the region N of FIG. 2B are moved to the left due to the asymmetric shape of the temperature profile T'. By repeatedly inducing the temperature profile T and the temperature profile T' by repeatedly and alternately energizing the resistance strips of the heating elements 21a and 22a by the driving currents $\phi 1$ and $\phi 2$, the trapped flux quanta are moved consecutively to the left and ultimately expelled from the superconducting circuit 10.

The actual temperature profile needed for the elimination of the trapped flux quantum depends on the heat conduction around the superconducting circuit chip which in turn is determined by the packaging or other environmental conditions. Typically, a slope of 1 degree/100 $\mu$m or more is preferred at the gentle or less steep side of the temperature profile. It should be noted that, when the slope is too steep, the required number of resistance strips of the heating element increases excessively. Further, the time needed for the elimination process of the magnetic flux increases because of the reduced speed of movement of the flux quantum. On the other hand, when the slope is too gentle and close to flat, the systematic temperature difference that is induced in the superconducting circuit is decreased and, although the speed of movement of the flux quantum upon the cooling of the superconducting circuit is increased, there arises a substantial chance that the fluctuation in the temperature causes a new trapping of magnetic flux upon cooling.

FIG. 3 shows the construction of the system of the present embodiment in a plan view.

The system 11 has a generally rectangular shape and includes a number of resistance strips 22a1, 22a2, ..., 22ai (corresponding to resistance strips 22a1, 22a2, 22a3 and 22a4 of heating elements 22a of FIG. 2A) on the substrate 20 in correspondence to the heater 22a. Alternatively, the system may have resistance strips 22a1' and 22a2'. The superconducting circuit 10 may be a conventional SQUID that includes a resistance 16, and inductance 14 and a Josephson junction 12 as illustrated. However, the superconducting circuit to which the system of the present invention is applicable is by no means limited to such a SQUID circuit. In FIG. 3, only the construction of the heating part 20b is illustrated.

In the illustrated example, the resistance strips 22a1, 22a2, ..., 22ai are grouped together into the heating element 22a, and the driver 24a supplies the driving current $\phi 1$ having a first polarity to the resistance strip 22a1 and another driving current $-\phi 1$ having the same magnitude but opposing polarity to the adjacent resistance strip 22a2. Thereby, there is formed a kind of magnetic dipole by the resistance strips 22a1 and 22a2, and the magnetic field produced by the currents $\phi 1$ and $-\phi 1$ decreases it strength as a function of $1r^3$ with a distance from origin 0 (shown in FIG. 4A). In other words, by configuring the heating part 20b as such, the magnetic field produced by the driving current of the heating elements decreases rapidly with distance from the plane of the heating part 20b, and the penetration of such magnetic field into the superconducting circuit 10 at the time of foregoing processing is minimized. The present principle for decreasing the penetration of the magnetic flux produced by the driving current into the superconducting conducting circuit 10 is of course applicable to the heating part 20a that is located above the heating part 20b. The resistance strips 22a1 and 22a2 may be connected in series as shown by a reference numeral 26 in FIG. 3 and driven by a driver 24b that supplies the drive current $+\phi 1$ and receives the current as the drive current $-\phi 1$.

FIG. 4A shows the construction resistance strips 22a1 and 22a2 of each of the heating elements 22a;. As illustrated, the heating element 22a includes a pair of resistance strips 22a1 and 22a2 that are arranged to form a magnetic dipole upon energization. Because of the opposing directions of the drive currents $+\phi 1$ and $-\phi 1$ in the conductor strips 22a1 and 22a2, the magnetic fields $\phi$ induced by the driving currents have the opposing polarities, Thereby the magnetic dipole is formed as already described when viewed in the direction of elongation of the pair of resistance strips 22a1 and 22a1'.

The foregoing attenuation of the magnetic field with the distance from the heating part is further enhanced when each of the heating element 22a is includes four resistance strips 22a1, 22a2, 22a1' and 22a2, arranged as shown in FIG. 4B. In FIG. 4B, the drive current $+\phi 1$ is caused to flow through the resistance strips 22a1 and 22a' while the drive current $-\phi 1$ is caused to flow through the resistance strips 22a2 and 22a2'. In this case there is formed a magnetic quadrupole characterized by the magnetic field which decreases a strength with the distance r from origin O' according to a function $1/r^5$ In forming the magnetic quadrupole, it should be noted that the strips $22a'$, and $22a2'$ need not be a resistance strip but may be a simple superconductor strip as long as they induce the magnetic field $\phi$ with the polarity that is opposite to the polarity of the magnetic field $\phi$ induced by the corresponding resistance strips $22a1$ and $22a2$. In this construction, the strength of the magnetic field becomes several micro-Gauss when separated from the heating part by about 300 μm. This separation is about the same as the thickness of the substrate $10a$ of the superconducting circuit 10, even if a drive current of about 10 mA is applied. It should be noted that the foregoing magnitude of several micro-Gauss of the magnetic field that is caused by the drive current is smaller than the earth's magnetic field by a factor of about $10^5$. Thus, the risk that the magnetic flux is trapped upon the energization of the heating elements forming the heating parts $20a$ and $20b$ is substantially eliminated, even when the superconducting circuit has a size of about 1 mm × 1 mm.

Figure 5:
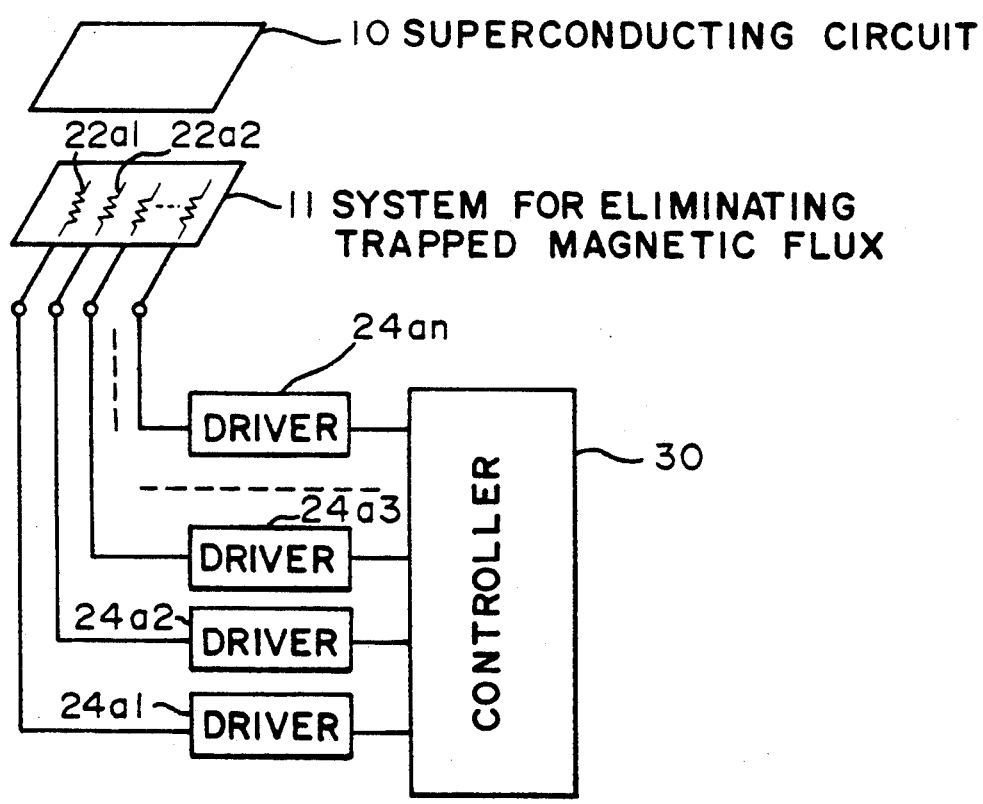
FIG. 5 is a diagram showing the overall view of the system for eliminating the trap of magnetic flux according to the first embodiment.

FIG. 5 shows the overall construction of the system of the present embodiment employed for the elimination of trapped magnetic flux from a superconducting circuit.

Referring to FIG. 5, each of the resistance strips $22a1, 22a2, \ldots$ is connected to a corresponding driver $24a1, 24a2, \ldots$ that in turn is connected to a controller 30. The controller 30 selectively energizes the drivers $24a1, 24a2, \ldots$ and in response thereto, the resistance strips $22a1, 22a2, \ldots$ are energized alternately as already described with reference to FIGS. 2B and 2C. The controller 30 controls the energization such that the temperature of the superconducting circuit 10 is raised and lowered at a speed that is equal to or smaller than the thermal time constant of the circuit including the substrate $10a$ to preserve the temperature profile. This time constant is typically about several milliseconds.

Figure 6:
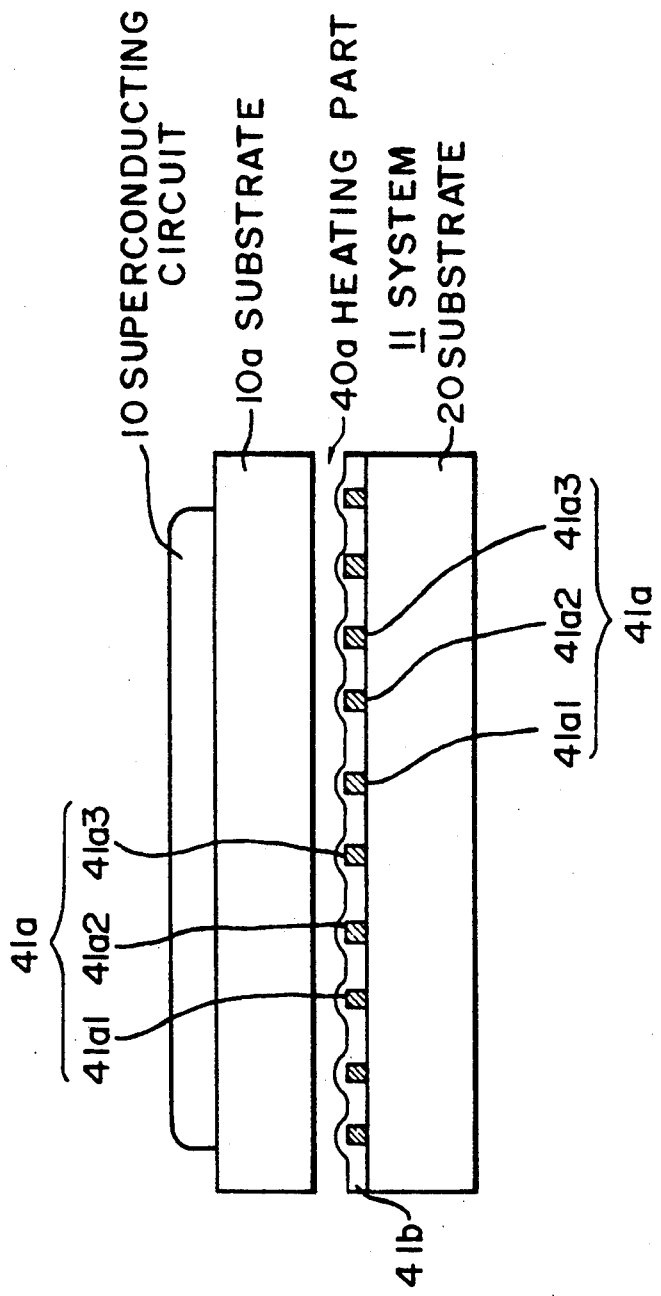
FIG. 6 is a diagram showing a second embodiment of the present invention.

Next, a second embodiment of the present invention will be described with reference to FIG. 6.

In the present embodiment, there is provided a single layer heating part $40a$ on the top surface of the substrate 20 of the system 11 wherein a number of elongated heating elements $41a$ are embedded parallel with each other in an insulator layer $41b$ similarly to the construction of FIG. 2A. The remarkable feature of the present invention is that the heating elements $41a$ are embedded with a uniform pitch contrary to the case of the embodiment of FIG. 2A, and that the heating elements $41a$ are formed from repetition of three resistance strips $41a1$, $41a2$ and $41a3$ that are arranged with a uniform pitch throughout the part $40a$. Thereby, the separation of the resistance strips $41a1$, $41a2$ and $41a3$ is made uniform and identical throughout the heating part $40a$.

Figure 7:
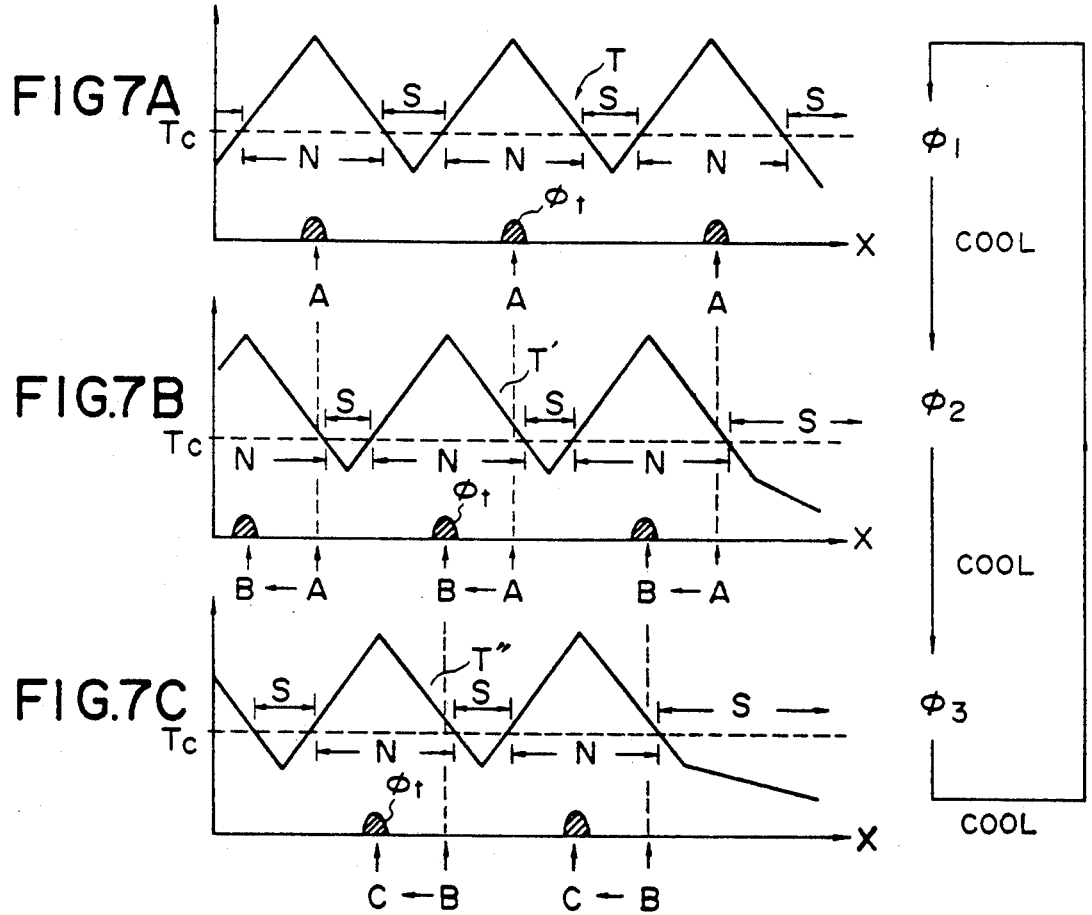
FIGS. 7A-7C are diagrams showing the driving sequence employed in the second embodiment of the present invention.

In operation, the resistance strips $41a1$, $41a2$ and $41a3$ are driven independently by three-phase driving currents $\phi1$, $\phi2$ and $\phi3$ having respective phases that differ from each other by 120 degrees. Thus, in a first step shown in FIG. 7A, the resistance strips $41a1$ are energized by the driving current $\phi1$ to form a number of normal conduction regions N separated from each other in the superconducting circuit 10 by superconducting regions S similarly to the case of FIG. 2B. The difference from the case of FIG. 2B is that the temperature profile T of FIG. 7A is symmetrical with respect to the horizontal dimension × because of the uniform distribution of the heating elements. Subsequent to the energization of the resistance strips $41a1$, the drive current $\phi1$ is deenergized and the temperature is decreased while preserving the symmetric temperature distribution profile. Thereby, the magnetic flux that has been trapped in the normal conduction region N as the flux quantum is collected at the location A corresponding to the peak temperature of the temperature profile T as shown by the symbol $\phi_t$.

Next, the resistance strips $41a2$ are energized by the drive current $\phi2$, and a number of normal conduction regions N are formed such that each region N is laterally bounded by superconducting regions S as shown in FIG. 7B. It is important to note that the normal conduction region N thus formed in FIG. 7B is shifted to the left as compared to the region N shown in FIG. 7A, and the location A where the flux quantum has been trapped is included in the region N thus newly formed. Further, the drive current $\phi2$ is deenergized subsequently, and the magnetic flux at the location A is pushed to a location B that corresponds to the peak of the temperature profile in FIG. 7B, in response to the cooling that occurs as a result of the deenergization of the drive current $\phi2$. It should be noted that the temperature profile T of FIG. 7B is maintained during the cooling process. Thereby, there occurs a movement of the flux quantum to the left from the location A to the location B.

Further, the resistance strip $41a3$ is energized by the drive current $\phi3$ in a step that follows the step of FIG. 7B. Thereby, the temperature profile T shown in FIG. 7C appears. In this case, too, there appears the region N of normal conduction and the region S of superconduction such that the region N is laterally bounded by the region S of FIG. 7C. It should be noted that the region N and the region S thus formed are shifted to the left as compared to the region N and the region S of FIG. 7B. Again, the temperature profile T of FIG. 7C is set such that the location B corresponding to the peak temperature of the previous step is included in the region N of FIG. 7C. After the temperature profile of FIG. 7C is set, the drive current $\phi3$ is deenergized and the temperature of the superconducting circuit 10 is decreased while maintaining the symmetric temperature profile T. Thereby, the flux quantum trapped at the location B is moved to the left to a location C that corresponds to the peak temperature of the temperature profile of FIG. 7C. Further, by repeating the steps of FIGS. 7A-7C, the trapped flux quantum is transferred to the left consecutively and ultimately expelled from the superconducting circuit 10. It should be noted that the temperature profiles T, T' and T" employed in the second embodiment are not necessarily be symmetric but asymmetric sawtooth gradient as shown in FIG. 2B may be employed as well. Further, the number of phases of the drive current for energizing the heating elements $41a$ is not limited to three but four, five or more phases may be employed.

In the foregoing first and second embodiments, it is important to note that the energization of the drive current is made such that there remains the superconducting region S at both sides of the normal conduction region N. Otherwise, the process becomes a mere repetition of the heating and cooling process and the foregoing systematic movement of the flux quantum in a particular direction would not occur.

Figure 8:
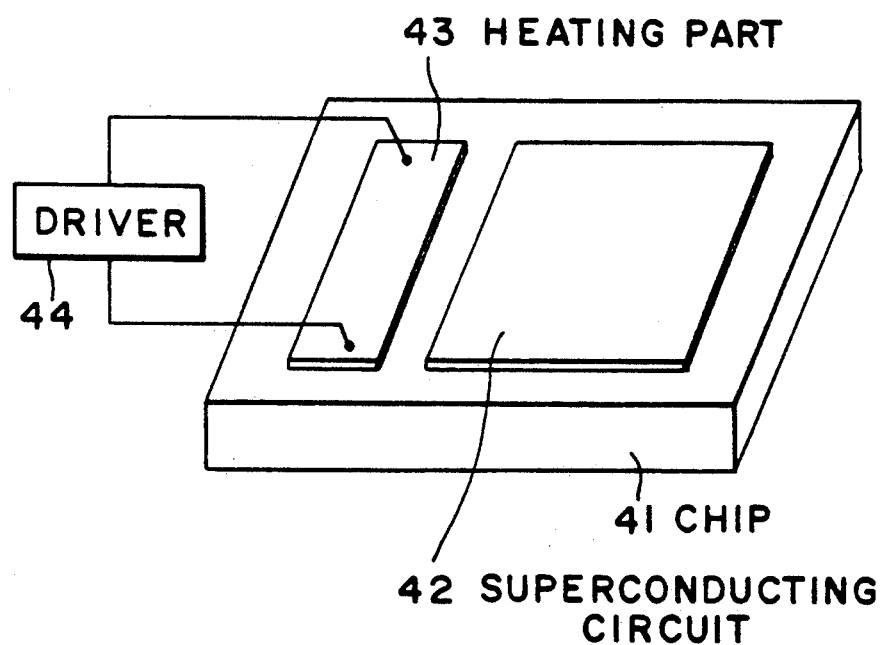
FIG. 8 is a perspective view showing a third embodiment of the present invention.

Next, a third embodiment of the present invention will be described with reference to FIG. 8.

Figure 9:
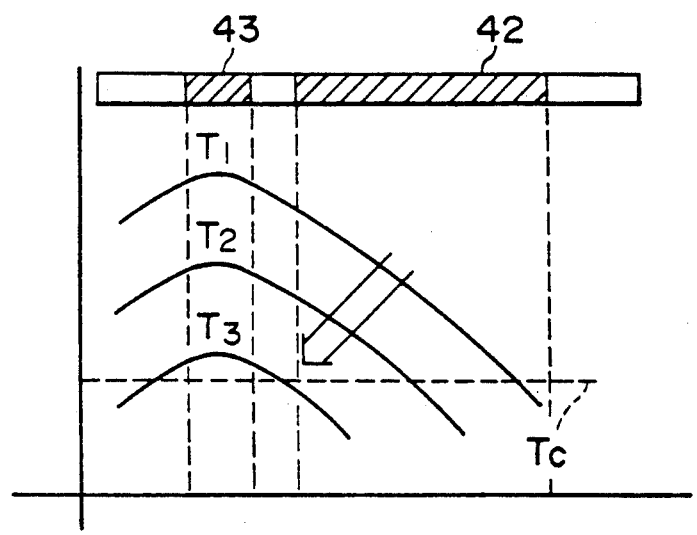
FIG. 9 is a diagram for explaining the operation of the system of FIG. 8.

In this embodiment, a superconducting circuit 42 is formed on a surface of a chip 41 of a semiconductor material such as silicon and there is provided a heating part 43 on the surface of the chip 41 adjacent to the superconducting circuit 42. The heating part 43 is energized by a driver 44 connected thereto. Upon energization, the heating part 43 heats the superconducting circuit 42 laterally and induces a temperature profiles T1, T2 and T3 shown in FIG. 9, wherein the temperature profile T1 corresponds to the maximum energization. As shown therein, there appears a peak of the temperature profile in correspondence to the heating part 43 while a gently declining temperature profile is formed in correspondence to the superconducting circuit 42. It should be noted that the region of the superconducting circuit 42 of which temperature exceeds the critical temperature Tc of the normal conduction-superconduction transition assumes the normal conduction state, while the region of which temperature is lower than the critical temperature Tc assumes the superconducting state.

Figure 10:
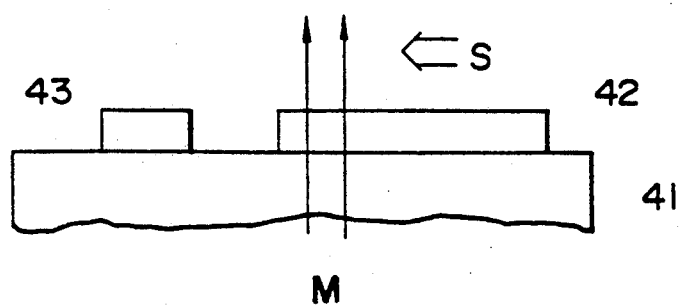
FIG. 10 is a diagram showing the operation of the system of FIG. 8 for eliminating the trapped flux quantum from a superconducting circuit.

By decreasing the energization of the heating part 43 with a time constant that is smaller than the thermal time constant of the superconducting circuit 42, the temperature of the superconducting circuit 42 is decreased without changing the profile as shown by the curves T1, T2 and T3. In response to the decease in the temperature, the region of the superconducting state grows toward the direction of the heating part as shown in FIG. 10 by an arrow S, and in response thereto, the magnetic flux M is moved toward the left. Ultimately, the magnetic flux M is expelled from the superconducting circuit 42.

Figure 12:
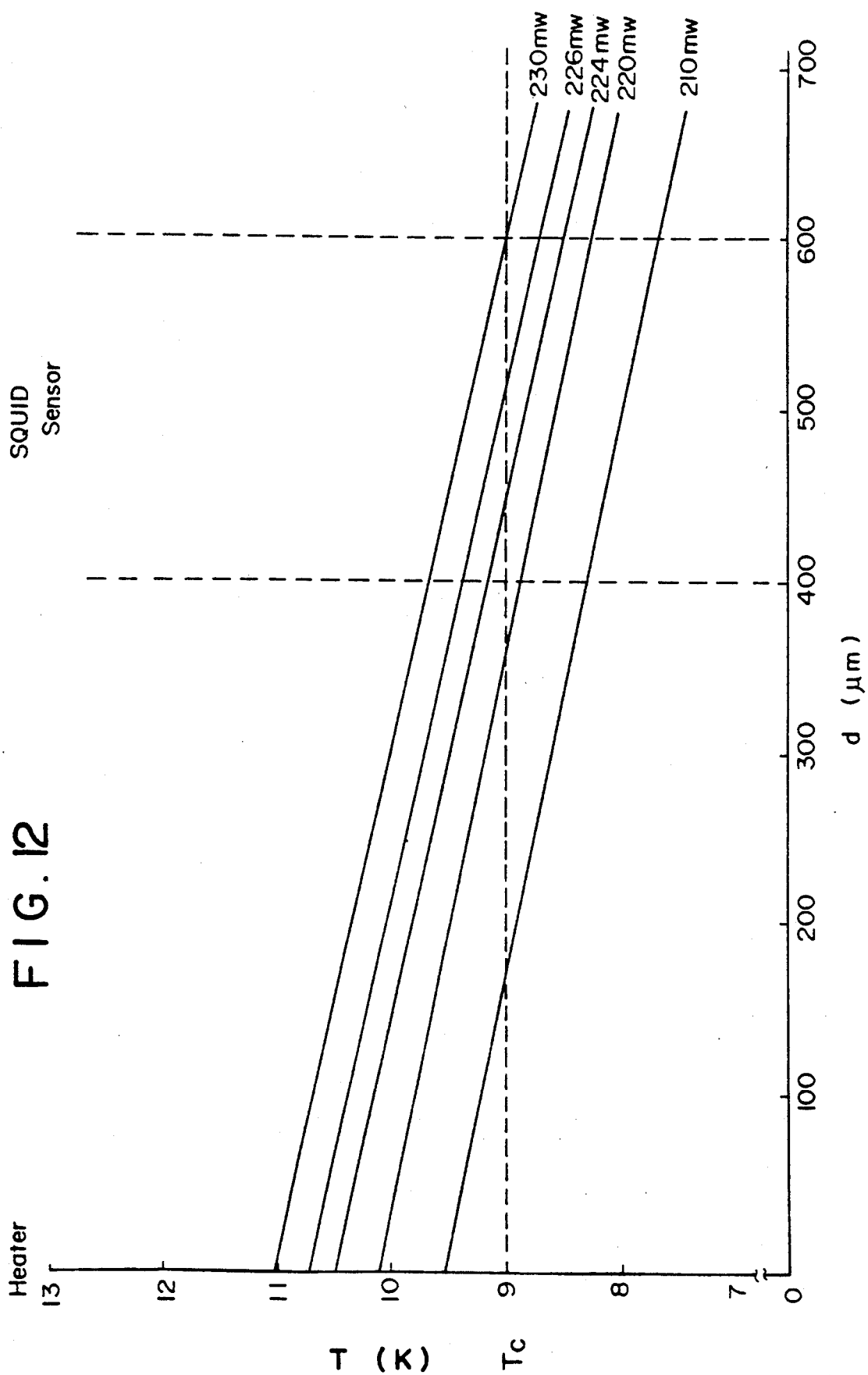
FIG. 12 is a diagram showing the distribution of the temperature realized in the superconductor circuit by the construction of FIG. 8.

FIG. 12 shows a result of simulation undertaken for the superconducting circuit 42 that is heated laterally by a heating part 43 offset laterally from the circuit 42 with a distance of 0.4 mm–0.6 mm. This drawing shows the temperature profile that is achieved in the circuit 42 for the case that the energization of the heating part 43 is changed variously in the range between 210 mW and 230 mW. It should be noted that the critical temperature Tc is about 9 K in this case. As can be seen therein, there appears a monotonous declining profile wherein the temperature of the superconducting circuit 42 decreases monotonously with increasing distance from the heating part. It should be noted that the abscissa of FIG. 12 represents the distance from the heating part 43 represented in microns. As can be seen clearly, the region of the superconducting state grown with decreasing energization and the construction of the present invention is effective in eliminating the trapped magnetic flux from the superconducting circuit.

Figure 13B:
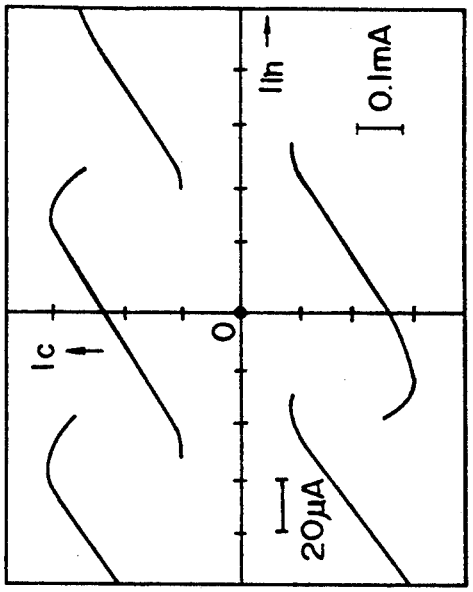
FIGS. 13A and 13B are graphs showing the effect achieved by the system of FIG. 8.
Figure 13A:
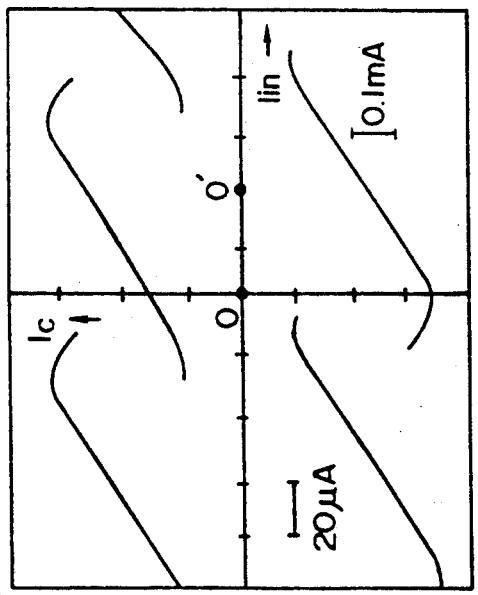

FIGS. 13A and 13B are graphs showing the effect of the present embodiment, wherein the threshold characteristic of a typical SQUID device is shown. As is well known, the SQUID has positive and negative critical currents Ic that change with the input current $I_{in}$, wherein the positive critical current increases its magnitude with increasing input current and the negative critical current decreases its magnitude with increasing input current. If there is no trapped flux quantum, the positive critical current and the negative critical current are symmetrical with respect to the origin 0 characterized by the zero input current $I_{in}$ and the zero critical current Ic. When there is a trapped flux quantum in the SQUID, the origin 0 of the threshold characteristic shifts along the input current axis to a point 0' as shown in FIG. 13A. Thereby, the symmetry of the critical currents with respect to the origin 0 is lost. When the process for eliminating the trapped flux quantum of the present embodiment is applied, it was found that the origin of the threshold characteristic returns to the origin 0 as shown in FIG. 13B, indicating that the elimination of the flux quantum is successfully achieved.

Figure 11:
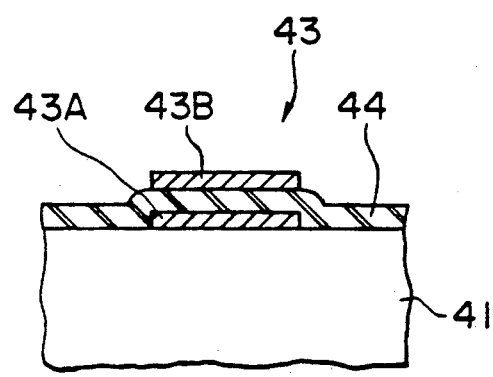
FIG. 11 is an enlarged cross-sectional view showing the structure of a heating element employed in the system of FIG. 8.

FIG. 11 shows the construction of the heating part 43. Similar to the foregoing embodiments, the heating part 43 comprises a first resistance strip 43a provided on the substrate 41 and a second resistance strip 43b separated from the strip 43a by an insulator film 44. In operation, the resistance strips 43a and 43b are energized by respective drive currents that have an identical magnitude but opposing polarity. Thereby, the magnetic fields accompanying the driving currents are canceled each other similar to the case of FIG. 4A. Of course, it is not necessary that the strips 43a and 43b are both resistance strips but one of the strips 43a and 43b may be a superconducting strip.

Figure 14:
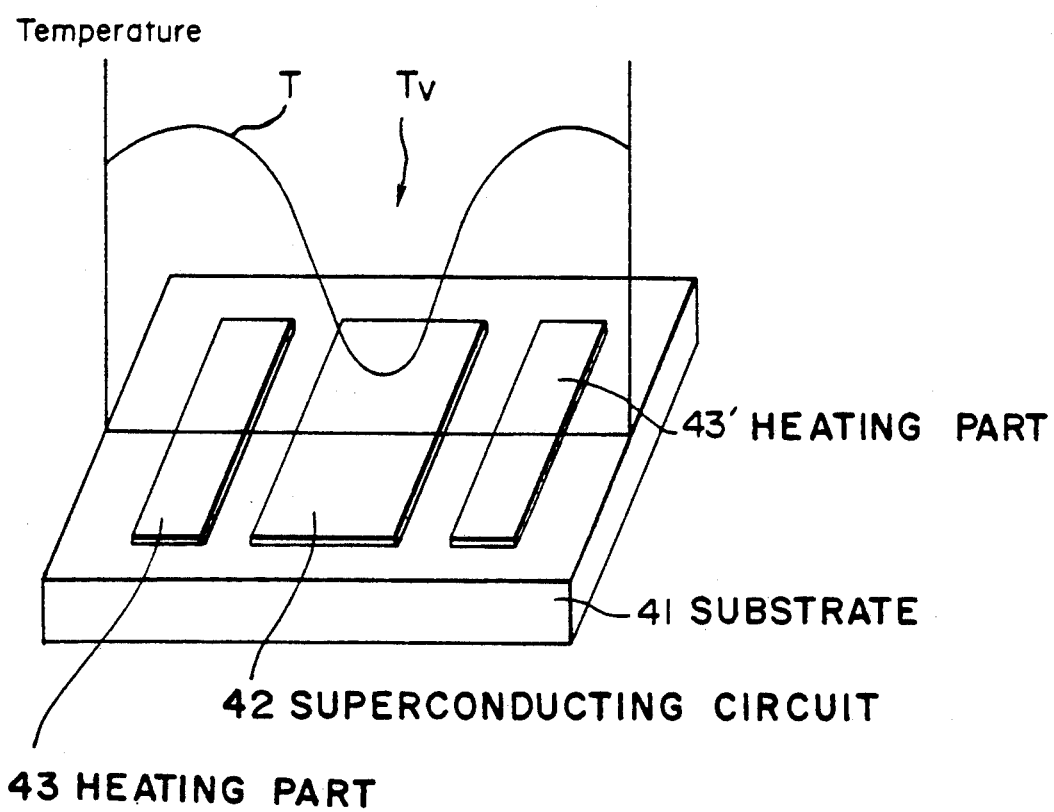
FIG. 14 is a perspective view showing a fourth embodiment of the present invention.

The present embodiment can be further modified as shown in FIG. 14, wherein there are provided a pair of heating parts 43 and 43' on the substrate 41 in correspondence to both sides of the superconducting circuit 42. In this case, the separation between the heating parts 43 and 43' are determined in consideration of the thermal conductivity and heat capacity of the substrate 41 as well as the superconducting circuit 42 such that there is formed a temperature profile T that has a valley Tv in correspondence to the superconducting circuit 42. In this construction, too, it is possible to expel the trapped flux quantum from the superconducting circuit 42 upon cooling the circuit 42 subsequent to the energization of the heating parts 43 and 43'.

Further, the present invention is not limited to the embodiments described heretofore, but various variations and modifications may be made without departing from the scope of the invention.

What is claimed is:

1. An apparatus for eliminating a magnetic flux from a superconducting circuit, said apparatus comprising:
   a substrate having top and bottom surfaces;
   a heating part having top and bottom surfaces and provided on the top surface of the substrate such that the bottom surface of the heating part faces the top surface of the substrate, said heating part comprising a plurality of heating elements that induce a temperature gradient, upon energization, in the superconduction circuit; and
   driving means connected to each of the heating elements in the heating part for energizing the heating elements by supplying a drive current;
   wherein two of said heating elements are located adjacent to one another to define a heating element pair, and the drive currents flowing through said heating elements of said pair are substantially equal in magnitude and opposite in direction.

2. An apparatus as claimed in claim 1 in which said plurality of heating elements extend generally parallel with each other with a mutual separation that increases consecutively in a direction perpendicular to a direction of extension of the heating elements.

3. An apparatus as claimed in claim 1, in which said plurality of heating elements extend generally parallel with each other in a first direction and arranged into a plurality of groups of heating elements that are driven separately by the driving means, each of said groups being repeated in a second direction perpendicular to the first direction.

4. An apparatus as claimed in claim 3, in which, in each group of the heating elements, the heating elements are arranged with a mutual separation that increases consecutively in said second direction.

5. An apparatus as claimed in claim 4 in which said plurality of heating elements are arranged into two different groups.

6. An apparatus as claimed in claim 5 in which said plurality of heating elements are arranged to form a region in the surrounding circuit in correspondence to each group, said region being defined by first and second sides extending in said first direction and separated from each other in said second direction, wherein said region is characterized by a temperature gradient that is steep at the first side and gentle at said second side, with a temperature peak formed at a position close to said first side relative to said second side.

7. An apparatus as claimed in claim 3, in which said plurality of the heating elements are arranged into more than two different groups.

8. An apparatus as claimed in claim 7, in which said plurality of the heating elements are arranged to form a region in the superconducting circuit in correspondence to each group, said region being defined by first and second sides extending in said first direction and separated from each other in said second direction, wherein said region is characterized by a temperature gradient that is steep at said first side and steep at said second side, with a temperature peak formed at a position close to said first side relative to said second side.

9. An apparatus as claimed in claim 4, in which said heating part comprises an insulator layer having a first surface coincident to the bottom surface of the heating part and a second surface coincident to the top surface of the heating part and the heating elements are embedded in the insulator layer.

10. An apparatus as claimed in claim 9, in which said heating elements are further provided on the second surface of the insulator layer such that the heating elements embedded in the insulator layer belong to a first group of the heating elements and the heating elements provided on the second surface of the insulator layer belong to a second, different group of the heating elements, wherein the first group of the heating elements are provided with a spatial offset with respect to the second group of the heating elements in the second direction.

11. An apparatus as claimed in claim 1 in which each said heating element comprises a plurality of resistance strips extending substantially parallel with each other.

12. An apparatus as claimed in claim 1 in which each said heating element comprises a resistance strip and a superconductor strip extending parallel to the resistance strip.

13. An apparatus as claimed in claim 1 in which each of said heating elements comprises plural pairs of electric current paths arranged parallel with each other.

14. An apparatus as claimed in claim 3, in which said heating part comprises a plurality of first group heating elements, each first group being repeated with a uniform mutual separation in the second direction a plurality of second group heating elements, each second group being repeated in the second direction with a mutual separation substantially identical with the mutual separation between the first group heating elements, each heating element of the second group being provided with an offset of about one-third of said mutual separation with respect to a corresponding heating element of the first group in the second direction, and a plurality of third group heating elements, each third group being repeated in the second direction with a mutual separation substantially identical with the mutual separation between the first group heating elements, each heating element of the third group being provided with an offset of about one-third of said mutual separation with respect to a corresponding heating element of the second group in the second direction.

15. An apparatus for eliminating a magnetic flux from a superconducting circuit, said apparatus comprising:
a substrate having an upper surface and a lower surface, said upper surface of the substrate having a region supporting the superconducting circuit;
heating means, provided on the upper surface of the substrate, for inducing a temperature gradient in the superconducting circuit upon energization of the heating means; and
driving means connected to the heating means for energizing the heating means.

16. An apparatus as claimed in claim 15 in which said heating means comprises a heating part provided at one side of the region of the substrate supporting the superconducting circuit, said heating part forming a monotonously changing temperature gradient in the superconducting circuit upon the energization by the driving means.

17. An apparatus as claimed in claim 15 in which said heating means comprise a first heating part provided at a first side of the region of the substrate supporting the superconducting circuit and a second heating part provided at a second side of said region, said first side of the region opposing said second side, said first and second heating parts forming a temperature distribution having a minimum and which increases monotonously at both sides of said minimum, in the superconducting circuit placed on said region.

18. An apparatus for eliminating a magnetic flux from a superconducting circuit said apparatus comprising:
a substrate on which the superconducting circuit is formed;
heating means comprising resistance heating elements, provided on the substrate;
driving means connected to the heating means for energizing the heating means by supplying a drive current to each of the resistance heating elements in said heating means;
wherein said heating means includes means for forming, upon energization of the resistance heating elements in the heating means, a region of normal conduction state characterized by a temperature that exceeds a critical temperature of the normal conduction-superconduction transition, in at least a part of the superconducting circuit, and for producing a minimized magnetic field upon the energization of the resistance heating elements, and
wherein said driving means includes means for controlling energization of the heating means such that the region of normal conduction state moves consecutively and continuously to a periphery of said superconducting circuit.

19. A method for eliminating trapped magnetic flux from a superconducting circuit held at a temperature below a critical temperature of a normal conduction-superconduction transition, comprising the steps of:
increasing the temperature of the superconducting circuit with a first temperature profile that changes periodically along the superconducting circuit in a predetermined direction thereof to form a plurality of normal conduction regions in which the temperature exceeds the critical temperature, said first temperature profile being so determined that said plurality of normal conduction regions are aligned in said predetermined direction and separated from each other by intervening superconducting regions, with a temperature peak formed in each of the normal conduction regions in correspondence to a first position defined in the superconducting circuit;

decreasing the temperature of the superconducting circuit while maintaining the shape of the first temperature profile until the normal conduction regions substantially disappear, to collect a magnetic flux that has been trapped in the superconducting circuit in correspondence to the normal conduction region at said first position corresponding to the temperature peak caused by the first temperature profile;

heating the superconducting circuit, after the step of decreasing the temperature of the superconducting circuit while maintaining the shape of the first temperature profile, with a second temperature profile that changes periodically along the superconducting circuit in the predetermined direction thereof to form a plurality of normal conduction regions in which the temperature exceeds the critical temperature, said second temperature profile being determined such that said plurality of normal conducting regions are aligned in said predetermined direction and separated from each other by intervening superconducting regions with a temperature peak formed in each of the normal conduction regions in correspondence to a second position of the superconducting circuit, said second temperature profile being so formed that the first position corresponding to the peak temperature of the first temperature profile is included in the normal conduction region that is formed by the second temperature profile; and decreasing the temperature of the superconducting circuit while maintaining the shape of the second temperature profile until the normal conduction regions formed as a result of the second temperature profile substantially disappear, to collect a magnetic flux that has been trapped in the superconducting circuit in correspondence to the normal conduction region at said second position corresponding to the temperature peak caused by the second temperature profile.

20. A method as claimed in claim 19 in which said superconducting circuit has a thermal time constant, and said steps of decreasing the temperature are performed at a rate substantially slower than the thermal time constant of the superconducting circuit.

21. A method as claimed in claim 19 in which said method further comprises a step of increasing the temperature of the superconducting circuit, performed after the step of decreasing the temperature of the superconducting circuit while maintaining the shape of the second temperature profile, with a third temperature profile that changes periodically along the superconducting circuit in the predetermined direction thereof to form a plurality of normal conduction regions in which the temperature exceeds the critical temperature, said third temperature profile being determined such that said plurality of normal conduction regions are aligned in said predetermined direction and separated from each other by intervening superconducting regions with a temperature peak formed in each of the normal conduction regions in correspondence to a third position of the superconducting circuit, said third temperature profile being so built that the second position corresponding to the peak temperature of the second temperature profile is included in the normal conduction region that is formed by the third temperature profile; and decreasing the temperature of the superconducting circuit while maintaining the shape of the third temperature profile until the normal conduction regions formed as a result of the third temperature profile substantially disappear, to collect a magnetic flux that has been trapped in the superconducting circuit in correspondence to the norma; conduction region at said third position correspondence to the temperature peak.

22. A method as claimed in claim 19 in which each of the normal conduction regions formed by the first, second and third temperature profiles is characterized by a first side and a second side, said second side opposing and being offset from said first side in said predetermined direction, each of said first, second and third temperature profiles being so shaped, in each of the normal conduction regions, to form a temperature gradient that is steep at said first side and gentle at said second side, with the temperature peak formed at a position close to said first side relative to said second side.

* * * * *

UNITED STATES PATENT AND TRADEMARK OFFICE
CERTIFICATE OF CORRECTION

PATENT NO. : 5,173,620

DATED : December 22, 1992

INVENTOR(S) : Norio FUJIMAKI et al.

It is certified that error appears in the above-identified patent and that said Letters Patent is hereby corrected as shown below:

Column 4, line 52, change "FIGS." to --FIG.--.

Column 5, line 27, change "∅," to --∅'--; and
line 44, change "B," to --B'--.

Column 6, line 31, after "20a" insert --and 20b are formed. The heating parts 20a and 20b are--.

Column 7, line 31, change "21a," to --22a of--
--resistance strips 21a1, 21a2, 21a3 and 21a4 in the heating elements 21a of the--, and change "20b" to --20a--.

Column 8, line 15, after "22a2" insert --(corresponding to a different configuration for the heating elements 22a of FIG. 2A)--;

line 31, change "it" to --its--, and change "1r$^3$" to --1/r$^3$--;

line 49, change "22a;" to --22a.--;

line 56, change "," to --.--;

line 57, after "described" insert --,--; and line 62, change "22a2," to --22a2'--, and after "arranged" insert --in a rectangle--.

UNITED STATES PATENT AND TRADEMARK OFFICE
CERTIFICATE OF CORRECTION

PATENT NO. : 5,173,620
DATED : December 22, 1992
INVENTOR(S) : Norio FUJIMAKI et al.

It is certified that error appears in the above-identified patent and that said Letters Patent is hereby corrected as shown below:

Column 8, line 65, change "22a'" to --22a1'--; and
line 68, change "a" to --the--, and change "the" to --a--.

Column 9, line 1, after "$1/r^5$" insert --.--; and
line 3, change "22a'" to --22a1'--.

Column 13, line 8, change "surrounding" to --superconducting--.

Column 14, line 37, after "circuit" insert --,--.

Column 16, line 34, change "norma;" to --normal--; and
lines 35 and 36, change "correspondence" to --corresponding--.

Signed and Sealed this

Twenty-second Day of March, 1994

Attest:

BRUCE LEHMAN

*Attesting Officer*  *Commissioner of Patents and Trademarks*